United States Patent
Sugimoto et al.

(10) Patent No.: US 6,642,167 B1
(45) Date of Patent: Nov. 4, 2003

(54) DIELECTRIC CERAMIC COMPOSITION, MONOLITHIC CERAMIC SUBSTRATE, CERAMIC ELECTRONIC COMPONENT, AND MONOLITHIC CERAMIC ELECTRONIC COMPONENT

(75) Inventors: Yasutaka Sugimoto, Kyoto; Takayuki Tsukizawa, Yokaichi, both of (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 662 days.

(21) Appl. No.: 09/707,629

(22) Filed: Nov. 6, 2000

(30) Foreign Application Priority Data

Nov. 9, 1999 (JP) ............................................ 11-318631
Nov. 10, 1999 (JP) ............................................ 11-319456

(51) Int. Cl.$^7$ ...................... C04B 35/468; H01G 4/12; H01B 7/00
(52) U.S. Cl. ............... 501/138; 174/120 R; 174/110 A; 361/321.4; 361/321.5
(58) Field of Search ................................. 501/138, 137, 501/139; 174/120 R, 110 A; 361/321.4, 321.5

(56) References Cited

U.S. PATENT DOCUMENTS 5,335,139 A * 8/1994 Nomura et al. ............... 361/4
5,407,876 A * 4/1995 Michiura et al. ............ 501/137
6,385,035 B1 * 5/2002 Matoba et al. ............ 361/321.1

FOREIGN PATENT DOCUMENTS

| JP | 5-325641 | 12/1993 |
| JP | 6-333426 | 12/1994 |
| JP | 8-45344 | 2/1996 |
| JP | 10-167817 | 6/1998 |

* cited by examiner

*Primary Examiner*—David Brunsman
(74) *Attorney, Agent, or Firm*—Dickstein, Shapiro, Morin & Oshinsky LLP

(57) ABSTRACT

A dielectric ceramic composition comprises 100 parts by weight of major component represented by the formula $BaO-x\{(1-y)TiO_2 \cdot yZrO_2\}$ wherein $3.5 \leq x \leq 4.5$ and $0 \leq y \leq 0.2$, and auxiliary components added to the main component. The auxiliary components comprises about 5 to 30 parts by weight, on a ZnO basis, of zinc compound about 0.5 to 6 parts by weight, on a $SiO_2$ basis, of silicon compound, about 0.1 to 3 parts by weight, on an oxide ($R_2O$) basis, of alkali metal compound wherein R is alkali metal, about 0.1 to 7 parts by weight, on a CuO basis, of copper compound, and about 0.1 to 6 parts by weight, on a $V_2O_5$ basis, of vanadium compound or about 0.1 to 6 parts by weight, on a $Bi_2O_3$ basis, of bismuth compound. This dielectric ceramic composition can be simultaneously sintered together with silver or copper at a temperature of 1,000° C. or less, and exhibits a high dielectric constant, a high Q value, a small change in dielectric property with temperature, and high environmental resistance. The composition is suitable for high-frequency electronic components.

20 Claims, 4 Drawing Sheets

DIELECTRIC CERAMIC COMPOSITION, MONOLITHIC CERAMIC SUBSTRATE, CERAMIC ELECTRONIC COMPONENT, AND MONOLITHIC CERAMIC ELECTRONIC COMPONENT

BACKGROUND OF THE INVENTION

1. Field of the Invention

The present invention relates to dielectric ceramic compositions which are suitable for the use in high-frequency regions, such as the microwave region and millimeter-wave region. In particular, the present invention relates to a dielectric ceramic composition which is suitable for miniaturization of products by laminating metallic electrode layers and sintering the laminate. The present invention also relates to a monolithic ceramic substrate, a ceramic electronic component and a monolithic ceramic component using the dielectric ceramic composition.

2. Description of the Related Art

In recent years, high-frequency dielectric ceramics have been widely used in, for example, dielectric resonators and dielectric substrates for monolithic integrated circuits (MICs). Major requirements for achieving miniaturization of the high-frequency dielectric ceramics are large dielectric constants, large Q values and small dependencies of dielectric constants on temperature.

Japanese Unexamined Patent Application Publication No. 6-333426 discloses a dielectric ceramic composition having a high specific dielectric constant ($\epsilon_r$) and a high Q value in which 0.5 percent by weight or less of $MnO_2$ and 1.2 percent by weight or less of $Ta_2O_5$ are added to a main component represented by BaO-x $\{(1-y)TiO_2.yZrO_2\}$. This dielectric ceramic composition is obtained by sintering at a high temperature of at least 1,300° C., and has a specific dielectric constant ($\epsilon_r$) of at least 38 and a Q value of at least 8,000.

It is necessary to use inexpensive metals having low resistance, such as Ag and Cu, as electrodes for use in high-frequency regions, such as dielectric resonators. Thus, the metal and ceramic must be sintered at a temperature which is lower than the melting point of the metal. The melting points of these metals, however, are in a range of 960° C. to 1063° C. and are significantly lower than the above-described sintering temperature, that is, at least 1,300° C., for the dielectric ceramic composition. Accordingly, the above dielectric ceramic composition suitable for high-frequency regions precludes use of these metals as internal electrode materials.

Japanese Unexamined Patent Application Publication No. 8-45344 discloses a dielectric ceramic composition in which at least one auxiliary component of 0.1 to 5 percent by weight of $GeO_2$ and 0.5 to 5 percent by weight of CuO is added to a major component represented by $xBaO-yTiO_2$ wherein x is in a range of 0.18 to 0.20, y is in a range of 0.80 to 0.82 and x+y=1. The addition of CuO and $GeO_2$ facilitates sintering at a lower temperature, that is, 1000° C.

The $GeO_2$ used in the above composition is, however, relatively expensive and exhibits poor water resistance. Since silver has a high electrical conductivity and is relatively inexpensive, it is most suitable as an electrode material which can be sintered in air. Silver, however, has a melting point of 962° C. and thus cannot be simultaneously sintered together with this dielectric ceramic composition.

Japanese Unexamined Patent Application Publication No. 5-325641 discloses a B-$TiO_2$-$Zro_2$ dielectric ceramic composition which can be sintered at a low temperature of 900° C. by adding $B_2O_3$. $B_2O_3$, however, is hygroscopic. Even when a glass component containing excess $B_2O_3$ is used instead of the addition of the $B_2O_3$, the composition is chemically unstable due to elution of the $B_2O_3$ from the glass component. Moreover, the use of the glass component increases cost. Since this composition exhibits relatively low sinterability, the raw materials must be pulverized to an average grain size of 0.6 μm or less before sintering. This is also a factor increasing the cost.

Japanese Unexamined Patent Application Publication No. 10-167817 discloses a dielectric ceramic composition containing 100 parts by weight of BaO-x$(Ti_{1-a}Zr_a)O_2$ as a major component wherein $3.5 \leq x \leq 4.5$ and $0 \leq a \leq 0.20$, 4 to 30 parts by weight, on a ZnO basis, of a zinc compound, 1 to 20 parts by weight, on a $B_2O_3$ basis, of a boron compound, 1 to 10 parts by weight, on an alkali metal carbonate basis, of an alkali metal compound, and 0.01 to 7 parts by weight, on a CuO basis, of a copper compound. This dielectric ceramic composition can be sintered at 900° C. by the effects of these auxiliary components. This dielectric ceramic composition also contains the boron compound. Since $B_2O_3$ in the composition is chemically unstable, the composition exhibits deterioration of insulation resistance in high-temperature, high-humidity environments.

SUMMARY OF THE INVENTION

It is an object of the present invention to provide a dielectric ceramic composition which can be sintered together with low-resistance electrode materials, such as silver and copper, at a low temperature of not more than 1,000° C., which exhibits a high dielectric constant, a high Q value, a small rate of change in dielectric property with temperature, superior high-frequency characteristics and superior reliability in high-temperature, high-humidity environments.

It is another object of the present invention to provide a monolithic ceramic substrate, a ceramic electronic component and a monolithic ceramic electronic component which use the above dielectric ceramic composition and exhibit superior high-frequency characteristics and superior reliability in high-temperature, high-humidity environments.

According to an aspect of the present invention, a dielectric ceramic composition comprises 100 parts by weight of major component represented by the formula BaO-x $\{(1-y)TiO_2.yZrO_2\}$ wherein $3.5 \leq x \leq 4$ and $0 \leq y \leq 0.2$, a components added to the main component comprising about 5 to 30 parts by weight, on a ZnO basis, of a zinc compound, about 0.5 to 6 parts by weight, on a $SiO_2$ basis, of a silicon compound, about 0.1 to 3 parts by weight, on an oxide ($R_2O$) basis, of an alkali metal compound wherein R is alkali metal, about 0.1 to 7 parts by weight, on a CuO basis, of a copper compound, and about 0.1 to 6 parts by weight of, on a $V_2O_5$ basis, vanadium compound or on a $Bi_2O_3$ basis, a bismuth compound.

In this dielectric ceramic composition, the specific amounts of the auxiliary components are compounded to the major component represented by the above formula. This dielectric ceramic composition can be sintered at 1,000° C. or less, and exhibits a high dielectric constant, that is, of approximately 30 or more, and a high Q value, that is, of approximately 2,000 or more at 8 GHz.

Since the dielectric ceramic composition does not contain $B_2O_3$, the composition exhibits high stability in high-temperature, high-humidity environments.

Since the dielectric ceramic composition can be sintered at lower temperatures, the composition can be simultaneously sintered together with a low-resistance inexpensive metals, such as silver and copper. Simultaneous sintering of the dielectric ceramic composition of the present invention and the low-resistance metals facilitates miniaturization of monolithic ceramic electronic components.

Reasons for the limitation of the composition in the present invention are as follows. At x<3.5 or x>4.5, the temperature coefficient of the resonant frequency significantly shifts to the positive side, and the dielectric ceramic composition exhibits a large dependence of the dielectric constant on the temperature.

When $ZrO_2$ is partially replaced with $TiO_2$, the temperature coefficient of the resonant frequency shifts to the negative side. At y>0.2, however, the dielectric constant $\epsilon$ and the Q value decrease.

Preferably, $4.30 \leq x \leq 4.4$ and $0 < y \leq 0.1$. In this case, the composition is composed of a $Ba_2Ti_9O_{20}$ single phase, and exhibits a higher Q value.

The zinc compound contributes to an increased Q value and enhanced sinterability at low temperatures. When the content of the zinc compound is less than about 5 parts by weight, the composition does not have these advantages. When the content exceeds about 30 parts by weight, the dielectric constant $\epsilon$ decreases. Preferably, the zinc compound is added in an amount of about 6 to 13 parts by weight.

When the content of the silicon compound is less than about 0.5 parts by weight, humidity resistance of the composition decreases. When the content exceeds about 6 parts by weight, the composition cannot be sintered at a temperature of 1,000° C. or less. Preferably, the silicon compound is added in an amount of about 1 to 4 parts by weight.

The alkali metal compound is added in order to enhance sinterability at low temperatures. When the content thereof exceeds about 30 parts by weight, humidity resistance decreases. When the content is less than about 0.1 parts by weight, the composition cannot be sintered at low temperatures. Preferably, the alkali metal compound is added in an amount of about 0.5 to 2 parts by weight.

The vanadium or bismuth compound enhances sinterability at low temperatures. When the content thereof exceeds about 6 parts by weight, humidity resistance decreases. When the content is less than about 0.1 parts by weight, the composition cannot be sintered at low temperatures. Preferably, the vanadium compound is added in an amount of about 0.5 to 2 parts by weight, and the bismuth compound is added in an amount of about 0.5 to 3 parts by weight.

The copper compound contributes to enhanced sinterability at low temperatures and an increased dielectric constant $\epsilon$. When the content thereof is less than about 0.1 part by weight, the composition does not exhibit these advantages. When the content exceeds about 7 parts by weight, the Q value decreases. Preferably, the copper compound is added in an amount of about 2 to 6 parts by weight.

The dielectric ceramic composition in accordance with the present invention preferably contains about 0.5 parts by weight or less and more preferably about 0.3 parts by weight, on a $MnO_2$ basis, of a manganese compound and about 1.2 parts by weight or less and more preferably about 1.0 parts by weight, on a $Ta_2O_5$ basis, of a tantalum compound, as auxiliary compounds. The manganese compound and the tantalum compound contribute to a further increased Q value. The Q value, however, decreases when the content of the manganese compound exceeds about 0.5 parts by weight or when the content of the tantalum compound exceeds about 1.2 parts by weight.

At least one of the zinc compound, the silicon compound, the alkali metal compound, copper compound, and the bismuth compound is vitrified and added to the dielectric ceramic composition in accordance with the present invention. Since the reactivity to the major component is further enhanced, the composition can be sintered at even lower temperatures.

Any zinc compound, any silicon-compound, any alkali metal compound, any copper compound, any vanadium compound, any manganese compound and any tantalum compound may be used without limitation in the present invention.

Examples of zinc compounds include ZnO, $ZnCl_2$, ZnS, Zn, $Zn_2SiO_4$ and $Ba_3Ti_{12}Zn_7O_{34}$.

Examples of silicon compounds include $SiO_2$, $Na_4SiO_4$ and Si.

Examples of alkali metal compounds include $Li_2O$, $Li_2SO_4 \cdot H_2O$, $Li_3PO_4$, $LiNO_3$, $Li_2C_2O_4$ and $Li_2CO_3$. The alkali metals in the alkali metal compounds are not limited in the present invention, and include lithium, sodium and potassium. Among them, lithium is preferable.

Examples of copper compounds include CuO, Cu, $CuSO_4$, $Cu_2O$ and CuCl.

Examples of vanadium compounds include $V_2O_5$, $VOCl_3$ and $VOCl_2$.

Examples of bismuth compounds include $Bi_2O_3$, $BiCl_3$, Bi and $BiC_6H_5O_7$.

Examples of zinc compounds include $MnO_2$, $MnCO_3$ and $MnCl_2 \cdot 4H_2O$.

Examples of tantalum compounds include $Ta_2O_5$, $TaCl_5$ and Ta.

As described above, the dielectric ceramic composition in accordance with the present invention comprises the major components and the auxiliary components. In the production of the dielectric ceramic composition, raw materials for the major and auxiliary components are weighed, are pulverized, compounded, calcined, and repulverized to form calcined powder. The calcined powder is molded into a predetermined shape and is sintered.

The dielectric ceramic composition in accordance with the present invention can be sintered at a low temperature, that is, at not more than 900° C. in an air or under an oxygen atmosphere.

The raw materials may be hydroxides, carbonates or nitrates, which form oxides during sintering.

According to another aspect of the present invention, a monolithic ceramic substrate comprises a ceramic substrate including dielectric ceramic layers comprising the above dielectric ceramic composition and a plurality of internal electrodes formed in the dielectric ceramic layers. In this monolithic ceramic substrate, the dielectric ceramic layers are formed of the dielectric ceramic composition in accordance with the present invention and include the plurality of internal electrodes. Thus, the monolithic ceramic substrate can be sintered at a low temperature of 1,000° C. or less, and exhibits a high dielectric constant, a high Q value and a small rate of change in dielectric characteristics with temperature.

Specifically, a second ceramic layer having a dielectric constant which is lower than that of the dielectric ceramic layers is formed on at least one face of each of the dielectric ceramic layers.

In a preferred embodiment of the present invention, the plurality of the internal electrodes are stacked with at least part of the dielectric ceramic layers provided therebetween to form a monolithic capacitor.

More specifically, the plurality of internal electrodes comprise internal capacitor electrodes constituting a capacitor deposited with at least part of the dielectric ceramic layers therebetween, and coil conductors constituting a laminated inductor by being connected to each other.

According to another aspect of the present invention, a ceramic electronic component comprises the above monolithic ceramic substrate and at least one electronic element mounted on the monolithic ceramic substrate and constituting a circuit together with the plurality of internal electrodes.

Preferably, a cap is fixed to the monolithic ceramic substrate so as to surround the electronic elements. More preferably, a conductive cap is used as the cap.

More specifically, the ceramic electronic component further comprises a plurality of external electrodes formed only on the bottom face of the monolithic ceramic substrate, and a plurality of through hole conductors electrically connected to the external electrodes and to the internal electrodes or the electronic element.

According to another aspect of the present invention, a monolithic ceramic electronic component comprises a sintered ceramic body comprising the above-described dielectric ceramic composition, a plurality of internal electrodes arranged in the sintered ceramic body and a plurality of external electrodes formed on outer surfaces of the sintered ceramic body, each being electrically connected to one of the internal electrodes.

Specifically, the plurality of internal electrodes are overlaid with the ceramic layers provided therebetween so as to form a capacitor unit.

More specifically, the plurality of internal electrodes comprises the internal electrode constituting the capacitor unit and a plurality of coil conductors which are electrically connected to form a laminated inductor unit.

DESCRIPTION OF THE PREFERRED EMBODIMENTS

Figure 1:
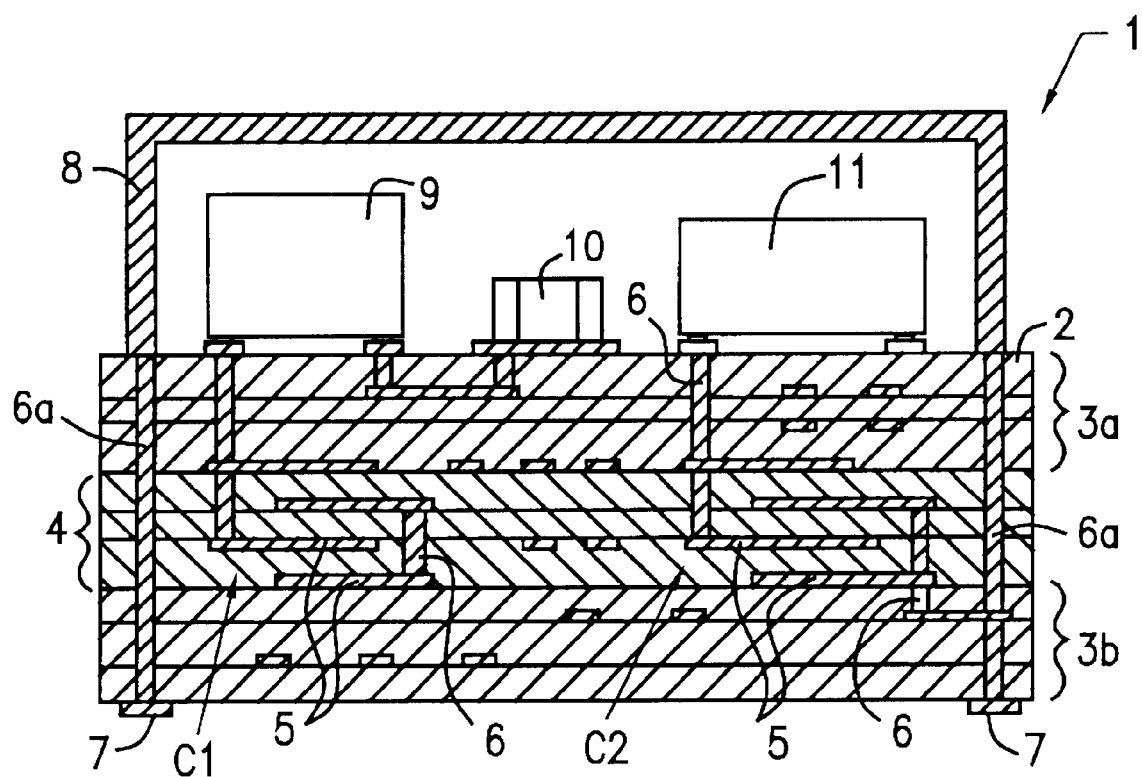
FIG. 1 is a longitudinal cross-sectional view of a monolithic ceramic module as a ceramic electronic component using a monolithic ceramic substrate as an embodiment of the present invention.

The dielectric ceramic composition in accordance with the present invention will now be described with reference to the following Examples. Also, the monolithic ceramic substrate, the ceramic electronic component and the monolithic ceramic electronic component in accordance with the present invention will be described with reference to the following Examples.

As starting materials, $BaCO_3$, $TiO_2$ and $ZrO_2$ were compounded according to the formulations shown in Tables 1 to 6 to form compounded mixtures. Each mixture was wet-mixed in a ball mill for 16 hours, dehydrated, dried and calcined at 1,200° C. for 2 hours to prepare a calcined material for the primary component.

As raw materials for the auxiliary components, ZnO, $Li_2CO_3$, $SiO_2$, $V_2O_5$ or $B_2O_3$, CuO, $Ta_2O_5$ and $MnCO_3$ were compounded together with the above calcined material for the primary component according to the formulations shown in Tables 1 to 6 to form ceramic mixtures. Each mixture was wet-mixed in a ball mill for 16 hours to form a ceramic slurry. The ceramic slurry wad dried to prepare a powdered mixture. The powdered mixture was molded under a pressure of 200 MPa to form a disk having a diameter of 10 mm and a thickness of 5 mm. The green disk compact was sintered at 900° C. for 2 hours to form a sintered disk.

The specific dielectric constant $\epsilon_r$ at a resonant frequency (approximately 8 GHz), the Q value and the resonant frequency temperature coefficient τf of each sintered disk were measured by a dielectric resonator method (short-circuited at both ends of a dielectric resonator), i.e., Hakki & Coleman method. The results are shown in Tables 1 to 6.

Using the above ceramic slurry, ceramic green sheets, each having a thickness of 50 μm, were formed by a doctor blade method. A silver electrode pattern is printed on each ceramic green sheet to form a laminate for the monolithic ceramic component. The laminate was sintered at 900° C. for 30 minutes to form a rectangular parallelepiped monolithic capacitor.

A voltage of 50 volts was applied to the rectangular parallelepiped monolithic capacitor and was allowed to stand in an atmosphere at 120° C., a relative humidity of 95% and 2 atmospheres for 200 hours, and the insulation resistance of the sample was measured. Samples having insulation resistances of $10^{10}$ Ω·cm Q·cm or less were classified as poor-humidity-resistance samples, which are denoted by "low humidity resistance (LHR)" in the Remarks columns in Tables 1 to 3.

In Tables 1 to 6, asterisked samples indicate that they are outside the scope of the present invention.

As shown in Tables 1 to 6, the dielectric ceramic composition in accordance with the present invention can be formed by sintering at low temperatures of 1000° C. or less, and exhibits a Q value of 1,200 or more at approximately 8 GHz and a specific dielectric constant of approximately 25 or more.

In Tables 1 to 6, the auxiliary component content is represented by parts by weight with respect to 100 parts by weight of the main component.

TABLE 1

| Sample | x | y × 100 | Ta₂O₅ | MnO₂ | ZnO | SiO₂ | V₂O₅ | Li₂O | CuO | Dielectric constant ε | Qf (GHz) at 8 GHz | τf (ppm/°C.) | Sintering Temp. (°C.) | Remarks |
|---|---|---|---|---|---|---|---|---|---|---|---|---|---|---|
| 1* | 3.00 | 1.8 | 0.6 | 0.1 | 9.4 | 1.9 | 1.2 | 1.2 | 3.3 | 28 | 7,000 | +50 | 900 | Large τf |
| 2 | 3.50 | 1.8 | 0.6 | 0.1 | 9.4 | 1.9 | 1.2 | 1.2 | 3.3 | 31 | 28,000 | +30 | 900 | |
| 3 | 4.35 | 1.8 | 0.6 | 0.1 | 9.4 | 1.9 | 1.2 | 1.2 | 3.3 | 32 | 30,000 | +7 | 900 | |
| 4 | 4.40 | 1.8 | 0.6 | 0.1 | 9.4 | 1.9 | 1.2 | 1.2 | 3.3 | 32 | 32,000 | +5 | 900 | |
| 5 | 4.45 | 1.8 | 0.6 | 0.1 | 9.4 | 1.9 | 1.2 | 1.2 | 3.3 | 32 | 29,000 | +7 | 900 | |
| 6 | 4.50 | 1.8 | 0.6 | 0.1 | 9.4 | 1.9 | 1.2 | 1.2 | 3.3 | 32 | 27,000 | +10 | 900 | |
| 7* | 5.00 | 1.8 | 0.6 | 0.1 | 9.4 | 1.9 | 1.2 | 1.2 | 3.3 | 29 | 8,000 | +40 | 900 | Large τf |
| 8 | 4.40 | 0 | 0.6 | 0.1 | 9.4 | 1.9 | 1.2 | 1.2 | 3.3 | 32 | 30,000 | +10 | 900 | |
| 9 | 4.40 | 10.0 | 0.6 | 0.1 | 9.4 | 1.9 | 1.2 | 1.2 | 3.3 | 32 | 20,000 | +6 | 900 | |
| 10 | 4.40 | 20.0 | 0.6 | 0.1 | 9.4 | 1.9 | 1.2 | 1.2 | 3.3 | 30 | 19,000 | +12 | 900 | |
| 11* | 4.40 | 30.0 | 0.6 | 0.1 | 9.4 | 1.9 | 1.2 | 1.2 | 3.3 | 30 | 8,000 | +20 | 900 | Low Qf |
| 12 | 4.40 | 1.8 | 0 | 0.1 | 9.4 | 1.9 | 1.2 | 1.2 | 3.3 | 32 | 28,000 | +5 | 900 | |
| 13 | 4.40 | 1.8 | 1.2 | 0.1 | 9.4 | 1.9 | 1.2 | 1.2 | 3.3 | 31 | 20,000 | +7 | 900 | |
| 14* | 4.40 | 1.8 | 2.0 | 0.1 | 9.4 | 1.9 | 1.2 | 1.2 | 3.3 | 31 | 9,000 | +10 | 900 | Low Qf |
| 15 | 4.40 | 1.8 | 0.6 | 0 | 9.4 | 1.9 | 1.2 | 1.2 | 3.3 | 32 | 15,000 | +4 | 900 | |
| 16 | 4.40 | 1.8 | 0.6 | 0.5 | 9.4 | 1.9 | 1.2 | 1.2 | 3.3 | 31 | 15,000 | +7 | 900 | |
| 17* | 4.40 | 1.8 | 0.6 | 1.0 | 9.4 | 1.9 | 1.2 | 1.2 | 3.3 | 31 | 8,000 | +12 | 900 | Low Qf |

TABLE 2

| Sample | x | y × 100 | Ta₂O₅ | MnO₂ | ZnO | SiO₂ | V₂O₅ | Li₂O | CuO | Dielectric constant ε | Qf (GHz) at 8 GHz | τf (ppm/°C.) | Sintering Temp. (°C.) | Remarks |
|---|---|---|---|---|---|---|---|---|---|---|---|---|---|---|
| 18* | 4.40 | 1.8 | 0.6 | 0.1 | 3 | 1.9 | 1.2 | 1.2 | 3.3 | 34 | 35,000 | +10 | 1,050 | HST |
| 19 | 4.40 | 1.8 | 0.6 | 0.1 | 5 | 1.9 | 1.2 | 1.2 | 3.3 | 33 | 32,000 | +8 | 950 | |
| 20 | 4.40 | 1.8 | 0.6 | 0.1 | 30 | 1.9 | 1.2 | 1.2 | 3.3 | 28 | 15,000 | +10 | 860 | |
| 21* | 4.40 | 1.8 | 0.6 | 0.1 | 40 | 1.9 | 1.2 | 1.2 | 3.3 | 24 | 9,000 | +20 | 840 | Low ε |
| 22* | 4.40 | 1.8 | 0.6 | 0.1 | 9.4 | 0.3 | 1.2 | 1.2 | 3.3 | 33 | 31,000 | +8 | 850 | LHR |
| 23 | 4.40 | 1.8 | 0.6 | 0.1 | 9.4 | 0.5 | 1.2 | 1.2 | 3.3 | 32 | 30,000 | +7 | 870 | |
| 24 | 4.40 | 1.8 | 0.6 | 0.1 | 9.4 | 6.0 | 1.2 | 1.2 | 3.3 | 31 | 25,000 | +7 | 970 | |
| 25* | 4.40 | 1.8 | 0.6 | 0.1 | 9.4 | 8.0 | 1.2 | 1.2 | 3.3 | 30 | 20,000 | +6 | 1,050 | HST |
| 26* | 4.40 | 1.8 | 0.6 | 0.1 | 9.4 | 1.9 | 0 | 1.2 | 3.3 | 31 | 22,000 | +10 | 1,020 | |
| 27 | 4.40 | 1.8 | 0.6 | 0.1 | 9.4 | 1.9 | 0.1 | 1.2 | 3.3 | 31 | 23,000 | +8 | 1,000 | |
| 28 | 4.40 | 1.8 | 0.6 | 0.1 | 9.4 | 1.9 | 6 | 1.2 | 3.3 | 30 | 25,000 | +7 | 850 | |
| 29* | 4.40 | 1.8 | 0.6 | 0.1 | 9.4 | 1.9 | 10 | 1.2 | 3.3 | 31 | 19,000 | +10 | 800 | LHR |
| 30* | 4.40 | 1.8 | 0.6 | 0.1 | 9.4 | 1.9 | 1.2 | 0 | 3.3 | 31 | 20,000 | +8 | 1,050 | HST |
| 31 | 4.40 | 1.8 | 0.6 | 0.1 | 9.4 | 1.9 | 1.2 | 0.1 | 3.3 | 31 | 22,000 | +8 | 1,000 | |
| 32 | 4.40 | 1.8 | 0.6 | 0.1 | 9.4 | 1.9 | 1.2 | 3 | 3.3 | 33 | 20,000 | +10 | 850 | |
| 33* | 4.40 | 1.8 | 0.6 | 0.1 | 9.4 | 1.9 | 1.2 | 5 | 3.3 | 32 | 15,000 | +10 | 810 | LHR |
| 34 | 4.40 | 1.8 | 0.6 | 0.4 | 9.4 | 1.9 | 1.2 | 1.2 (Na) | 3.3 | 32 | 30,000 | +6 | 900 | |
| 35 | 4.40 | 1.8 | 0.6 | 0.1 | 9.4 | 1.9 | 1.2 | 1.2 (K) | 3.3 | 32 | 31,000 | +6 | 900 | |

Note)
HST: high sintering temperature,
LHR: low humidity resistance

TABLE 3

| Sample | x | y × 100 | Ta₂O₅ | MnO₂ | ZnO | SiO₂ | V₂O₅ | Li₂O | CuO | Dielectric constant ε | Qf (GHz) at 8 GHz | τf (ppm/°C.) | Sintering Temp. (°C.) | Remarks |
|---|---|---|---|---|---|---|---|---|---|---|---|---|---|---|
| 36* | 4.40 | 1.8 | 0.6 | 0.1 | 9.4 | 1.9 | 1.2 | 1.2 | 0 | 31 | 28,000 | +5 | 1,030 | HST |
| 37 | 4.40 | 1.8 | 0.6 | 0.1 | 9.4 | 1.9 | 1.2 | 1.2 | 0.1 | 32 | 30,000 | +4 | 1,000 | |
| 38 | 4.40 | 1.8 | 0.6 | 0.1 | 9.4 | 1.9 | 1.2 | 1.2 | 7 | 34 | 15,000 | +2 | 860 | |
| 39* | 4.40 | 1.8 | 0.6 | 0.1 | 9.4 | 1.9 | 1.2 | 1.2 | 10 | 36 | 5,000 | −2 | 840 | Low Qf |
| 40* | 4.40 | 1.8 | 0.6 | 0.1 | 14 | 0 | 8.0 B₂O₅ | 1.0 | 2.5 | 33 | 25,000 | +50 | 900 | LHR |
| 41* | 4.40 | 1.8 | 0.6 | 0.1 | 0 | 0 | 0 | 0 | 3.3 | 34 | 15,000 | +10 | 1,050 | HST |
| 42* | 4.40 | 1.8 | 0.6 | 0.1 | 0 | 0 | 0 | 0 | 1.0 | 35 | 2,000 | +25 | 1,080 | HST |
| 45 | 4.40 | 1.8 | 0.6 | 0.1 | 9.4 | 1.9 | 1.2 | 1.2 | 3.3 | 32 | 33,000 | +5 | 900 | |

Note)
HST: high sintering temperature,
LHR: low humidity resistance

TABLE 4

| Sample | x | y × 100 | Ta$_2$O$_5$ | MnO$_2$ | ZnO | SiO$_2$ | Bi$_2$O$_3$ | Li$_2$O | CuO | Dielectric constant ε | Qf (GHz) at 8 GHz | τf (ppm/° C.) | Sintering Temp. (° C.) | Remarks |
|---|---|---|---|---|---|---|---|---|---|---|---|---|---|---|
| 101* | 3.00 | 1.8 | 0.6 | 0.1 | 9.4 | 1.9 | 1.2 | 1.2 | 3.3 | 29 | 5,040 | 36 | 900 | Large τf |
| 102 | 3.50 | 1.8 | 0.6 | 0.1 | 9.4 | 1.9 | 1.0 | 1.2 | 3.3 | 32 | 20,160 | 21 | 900 | |
| 103 | 4.35 | 1.8 | 0.6 | 0.1 | 9.4 | 1.9 | 1.0 | 1.2 | 3.3 | 33 | 21,600 | 5 | 900 | |
| 104 | 4.40 | 1.8 | 0.6 | 0.1 | 9.4 | 1.9 | 1.0 | 1.2 | 3.3 | 33 | 23,040 | 4 | 900 | |
| 105 | 4.45 | 1.8 | 0.6 | 0.1 | 9.4 | 1.9 | 1.0 | 1.2 | 3.3 | 33 | 20,880 | 5 | 900 | |
| 106 | 4.50 | 1.8 | 0.6 | 0.1 | 9.4 | 1.9 | 1.0 | 1.2 | 3.3 | 33 | 19,440 | 7 | 900 | |
| 107* | 5.00 | 1.8 | 0.6 | 0.1 | 9.4 | 1.9 | 1.0 | 1.2 | 3.3 | 30 | 5,760 | 28 | 900 | Large τf |
| 108 | 4.40 | 0 | 0.6 | 0.1 | 9.4 | 1.9 | 1.0 | 1.2 | 3.3 | 33 | 21,600 | 7 | 900 | |
| 109 | 4.40 | 10.0 | 0.6 | 0.1 | 9.4 | 1.9 | 1.0 | 1.2 | 3.3 | 33 | 14,400 | 4 | 900 | |
| 110 | 4.40 | 20.0 | 0.6 | 0.1 | 9.4 | 1.9 | 1.0 | 1.2 | 3.3 | 31 | 13,680 | 9 | 900 | |
| 111* | 4.40 | 30.0 | 0.6 | 0.1 | 9.4 | 1.9 | 1.0 | 1.2 | 3.3 | 31 | 5,760 | 14 | 900 | Low Qf |
| 112 | 4.40 | 1.8 | 0 | 0.1 | 9.4 | 1.9 | 1.0 | 1.2 | 3.3 | 33 | 20,610 | 4 | 900 | |
| 113 | 4.40 | 1.8 | 1.2 | 0.1 | 9.4 | 1.9 | 1.0 | 1.2 | 3.3 | 32 | 14,400 | 5 | 900 | |
| 114* | 4.40 | 1.8 | 2.0 | 0.1 | 9.4 | 1.9 | 1.0 | 1.2 | 3.3 | 32 | 6,480 | 7 | 900 | Low Qf |
| 115 | 4.40 | 1.8 | 0.6 | 0 | 9.4 | 1.9 | 1.0 | 1.2 | 3.3 | 33 | 20,880 | 3 | 900 | |
| 116 | 4.40 | 1.8 | 0.6 | 0.5 | 9.4 | 1.9 | 1.0 | 1.2 | 3.3 | 32 | 10,800 | 5 | 900 | |
| 117* | 4.40 | 1.8 | 0.6 | 1.0 | 9.4 | 1.9 | 1.0 | 1.2 | 3.3 | 32 | 5,760 | 9 | 900 | Low Qf |

TABLE 5

| Sample | x | y × 100 | Ta$_2$O$_5$ | MnO$_2$ | ZnO | SiO$_2$ | Bi$_2$O$_3$ | Li$_2$O | CuO | Dielectric constant ε | Qf (GHz) at 8 GHz | τf (ppm/° C.) | Sintering Temp. (° C.) | Remarks |
|---|---|---|---|---|---|---|---|---|---|---|---|---|---|---|
| 118* | 4.40 | 1.8 | 0.6 | 0.1 | 3 | 1.9 | 1.0 | 1.2 | 3.3 | 35 | 25,200 | 7 | 1,050 | HST |
| 119 | 4.40 | 1.8 | 0.6 | 0.1 | 5 | 1.9 | 1.0 | 1.2 | 3.3 | 34 | 23,040 | 6 | 950 | |
| 120 | 4.40 | 1.8 | 0.6 | 0.1 | 30 | 1.9 | 1.0 | 1.2 | 3.3 | 29 | 10,800 | 7 | 860 | |
| 121* | 4.40 | 1.8 | 0.6 | 0.1 | 40 | 1.9 | 1.0 | 1.2 | 3.3 | 25 | 6,480 | 14 | 840 | Low ε |
| 122* | 4.40 | 1.8 | 0.6 | 0.1 | 9.4 | 0.3 | 1.0 | 1.2 | 3.3 | 34 | 22,320 | 6 | 850 | LHR |
| 123 | 4.40 | 1.8 | 0.6 | 0.1 | 9.4 | 0.5 | 1.0 | 1.2 | 3.3 | 33 | 21,600 | 5 | 870 | |
| 124 | 4.40 | 1.8 | 0.6 | 0.1 | 9.4 | 6.0 | 1.0 | 1.2 | 3.3 | 32 | 18,000 | 5 | 970 | |
| 125* | 4.40 | 1.8 | 0.6 | 0.1 | 9.4 | 8.0 | 1.0 | 1.2 | 3.3 | 31 | 14,400 | 4 | 1,050 | HST |
| 126* | 4.40 | 1.8 | 0.6 | 0.1 | 9.4 | 1.9 | 0 | 1.2 | 3.3 | 32 | 15,840 | 7 | 1,020 | |
| 127 | 4.40 | 1.8 | 0.6 | 0.1 | 9.4 | 1.9 | 0.1 | 1.2 | 3.3 | 32 | 16,560 | 6 | 1,000 | |
| 128 | 4.40 | 1.8 | 0.6 | 0.1 | 9.4 | 1.9 | 6 | 1.2 | 3.3 | 31 | 18,000 | 5 | 850 | |
| 129* | 4.40 | 1.8 | 0.6 | 0.1 | 9.4 | 1.9 | 10 | 1.2 | 3.3 | 32 | 13,680 | 7 | 800 | LHR |
| 130* | 4.40 | 1.8 | 0.6 | 0.1 | 9.4 | 1.9 | 1.2 | 0 | 3.3 | 32 | 14,400 | 6 | 1,050 | HST |
| 131 | 4.40 | 1.8 | 0.6 | 0.1 | 9.4 | 1.9 | 1.0 | 0.1 | 3.3 | 32 | 15,840 | 6 | 1,000 | |
| 132 | 4.40 | 1.8 | 0.6 | 0.1 | 9.4 | 1.9 | 1.0 | 3 | 3.3 | 34 | 14,400 | 7 | 850 | |
| 133* | 4.40 | 1.8 | 0.6 | 0.1 | 9.4 | 1.9 | 1.0 | 5 | 3.3 | 33 | 10,800 | 7 | 810 | LHR |
| 134 | 4.40 | 1.8 | 0.6 | 0.4 | 9.4 | 1.9 | 1.0 | 1.2 (Na) | 3.3 | 33 | 21,600 | 4 | 900 | |
| 135 | 4.40 | 1.8 | 0.6 | 0.1 | 9.4 | 1.9 | 1.0 | 1.2 (K) | 3.3 | 33 | 22,320 | 4 | 900 | |

Note)
HST: high sintering temperature,
LHR: low humidity resistance

TABLE 6

| Sample | x | y × 100 | Ta$_2$O$_5$ | MnO$_2$ | ZnO | SiO$_2$ | Bi$_2$O$_3$ | Li$_2$O | CuO | Dielectric constant ε | Qf (GHz) at 8 GHz | τf (ppm/° C.) | Sintering Temp. (° C.) | Remarks |
|---|---|---|---|---|---|---|---|---|---|---|---|---|---|---|
| 136* | 4.40 | 1.8 | 0.6 | 0.1 | 9.4 | 1.9 | 1.0 | 1.2 | 0 | 32 | 20,160 | 4 | 1,030 | HST |
| 137 | 4.40 | 1.8 | 0.6 | 0.1 | 9.4 | 1.9 | 1.0 | 1.2 | 0.1 | 33 | 21,600 | 3 | 1,000 | |
| 138 | 4.40 | 1.8 | 0.6 | 0.1 | 9.4 | 1.9 | 1.0 | 1.2 | 7 | 35 | 10,800 | 1 | 860 | |
| 139* | 4.40 | 1.8 | 0.6 | 0.1 | 9.4 | 1.9 | 1.0 | 1.2 | 10 | 37 | 3,600 | −1 | 840 | Low Qf |
| 140* | 4.40 | 1.8 | 0.6 | 0.1 | 14 | 0 | 8.0 B$_2$O$_5$ | 1.0 | 2.5 | 33 | 25,000 | 50 | 900 | LHR |
| 141* | 4.40 | 1.8 | 0.6 | 0.1 | 0 | 0 | 0 | 0 | 3.3 | 34 | 15,000 | 10 | 1,050 | HST |
| 142* | 4.40 | 1.8 | 0.6 | 0.1 | 0 | 0 | 0 | 0 | 1.0 | 35 | 2,000 | 25 | 1,080 | HST |
| 145 | 4.40 | 1.8 | 0.6 | 0.1 | 9.4 | 1.9 | 1.2 | 1.2 | 3.3 | 32 | 33,000 | 5 | 900 | |

Note)
HST: high sintering temperature,
LHR: low humidity resistance

In Sample 45, vitrified Li$_2$O-CuO-ZnO-SiO$_2$-V$_{2O5}$ was added as the auxiliary component, and in Sample 145, vitrified Li$_2$O-CuO-ZnO-SiO$_2$-Bi$_2$O$_3$ was added as the auxiliary component.

As described above, the dielectric ceramic composition in accordance with the present invention can be sintered at a low temperature. Thus, the dielectric ceramic composition can be simultaneously sintered together with inexpensive metals having low resistance, and a monolithic high-frequency resonator can be formed by laminating the sheets of the dielectric ceramic composition.

Preferred embodiments of the monolithic ceramic substrate, the ceramic electronic component and the monolithic ceramic electronic component using the dielectric ceramic composition in accordance with the present invention will now be described.

Figure 2:
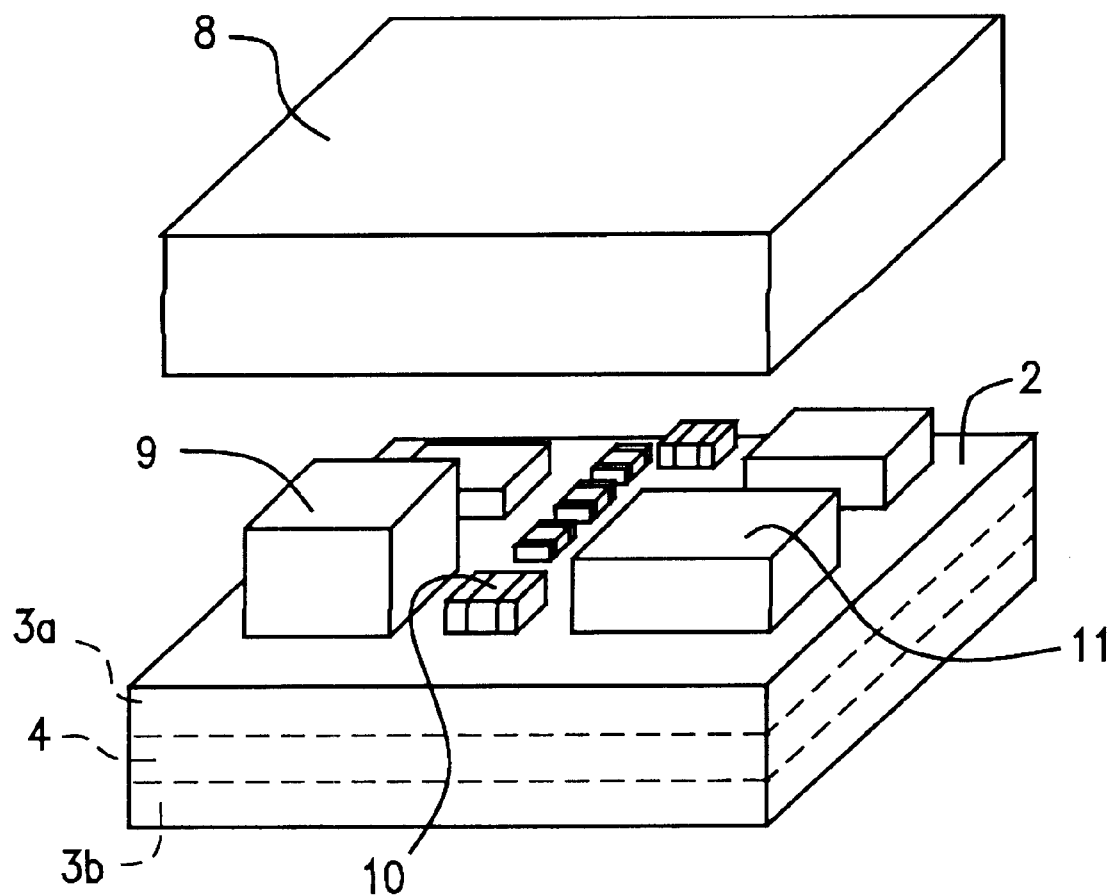
FIG. 2 is an exploded perspective view of the monolithic ceramic module shown in FIG. 1.

FIG. 1 is a cross-sectional view of a monolithic ceramic module as a ceramic electronic component including a monolithic ceramic substrate as an embodiment of the present invention, and FIG. 2 is an exploded perspective view of this monolithic ceramic module.

The monolithic ceramic module 1 includes the monolithic ceramic substrate 2. The monolithic ceramic substrate 2 includes insulating ceramic layers 3a and 3b and dielectric ceramic layers 4 disposed therebetween. The dielectric ceramic layers 4 are composed of the dielectric ceramic composition in accordance with the present invention and have a relatively high dielectric constant.

Ceramic materials for the insulating ceramic layers 3a and 3b are not limited as long as the dielectric constants thereof are lower than that of the dielectric ceramic layers 4. Examples of ceramic materials include alumina and quartz.

A plurality of internal electrodes 5 are disposed on the dielectric ceramic layers 4 in the monolithic ceramic substrate 2 to form monolithic capacitor units C1 and C2. A plurality of via hole electrodes 6 and 6a and internal leads are formed in the insulating ceramic layers 3a and 3b and the dielectric ceramic layers 4.

Electronic elements 9 to 11 are mounted on the monolithic ceramic substrate 2. Electronic elements, such as semiconductor devices and monolithic chip capacitors, can be used as the electronic elements 9 to 11. The via hole electrodes 6 and the internal leads electrically connect the electronic elements 9 to 11 to the capacitor units C1 and C2 so as to form a circuit of the monolithic ceramic module 1 in accordance with the present invention.

A conductive cap 8 is fixed on the upper face of the monolithic ceramic substrate 2. The conductive cap 8 is electrically connected to the via hole electrodes 6a which vertically pass through the monolithic ceramic substrate 2. External electrodes 7 are formed on the bottom face of the monolithic ceramic substrate 2 and are electrically connected to the via hole electrodes 6 and 6a, respectively. Other external electrodes (not shown in the drawing) are also formed on the bottom face of the monolithic ceramic substrate 2, and are electrically connected to the electronic elements 9 to 11 and the capacitor units C1 and C2 via internal leads.

Since the external electrodes 7 are formed only on the bottom face of the monolithic ceramic substrate 2, the monolithic ceramic module can be easily mounted onto a printed circuit board by utilizing the bottom face.

Since the cap 8 is composed of a conductive material and is electrically connected to the external electrodes through the via hole electrodes 6a, the conductive cap 8 can electromagnetically shield the electronic elements 9 to 11. The cap 8, however, may be composed of a material other than a conductive material.

Since the monolithic ceramic module 1 in this embodiment includes the monolithic capacitor units C1 and C2 composed of the dielectric ceramic composition in accordance with the present invention in the monolithic ceramic substrate 2, the internal electrodes 5, electrodes constituting external leads and the via hole electrodes 6 and 6a can be formed of an inexpensive metal having low resistance, such as silver or copper. Thus, the internal electrodes 5, electrodes for external leads, and the via hole electrodes 6 and 6a can be formed of an inexpensive metal having low resistance, such as silver or copper, by one-shot sintering. Since the capacitor units C1 and C2 can be formed in the monolithic ceramic substrate 2 prepared by the one-shot sintering, the monolithic ceramic module 1 can be miniaturized. Since the dielectric ceramic layers 4 are composed of the dielectric ceramic composition in accordance with the present invention, the dielectric ceramic layers 4 have a high dielectric constant and a high Q value. Accordingly, the monolithic ceramic module 1 is suitable for use in a high-frequency range.

The monolithic ceramic substrate 2 can be formed by a known one-shot ceramic sintering process. Ceramic green sheets composed of the dielectric ceramic composition in accordance with the present invention are prepared. A predetermined electrode pattern for the internal electrodes 5, external leads and the via hole electrodes 6 and 6a, is printed on each ceramic green sheet. These ceramic green sheets are laminated. Electrode patterns for the external leads and the via hole electrodes 6 and 6a are formed on a predetermined number of other ceramic green sheets for upper and lower insulating ceramic layers 3a and 3b. These ceramic green sheets are laminated and compressed in the thickness direction. The laminate is sintered to form the monolithic ceramic substrate 2.

In the monolithic capacitor units C1 and C2, dielectric ceramic layers having a high dielectric constant are disposed between the two adjacent internal electrodes 5 to generate electrostatic capacitance. Thus, a relatively large electrostatic capacitance can be generated between the internal electrodes 5 having relatively small areas. As a result, the device can be miniaturized.

Figure 3:
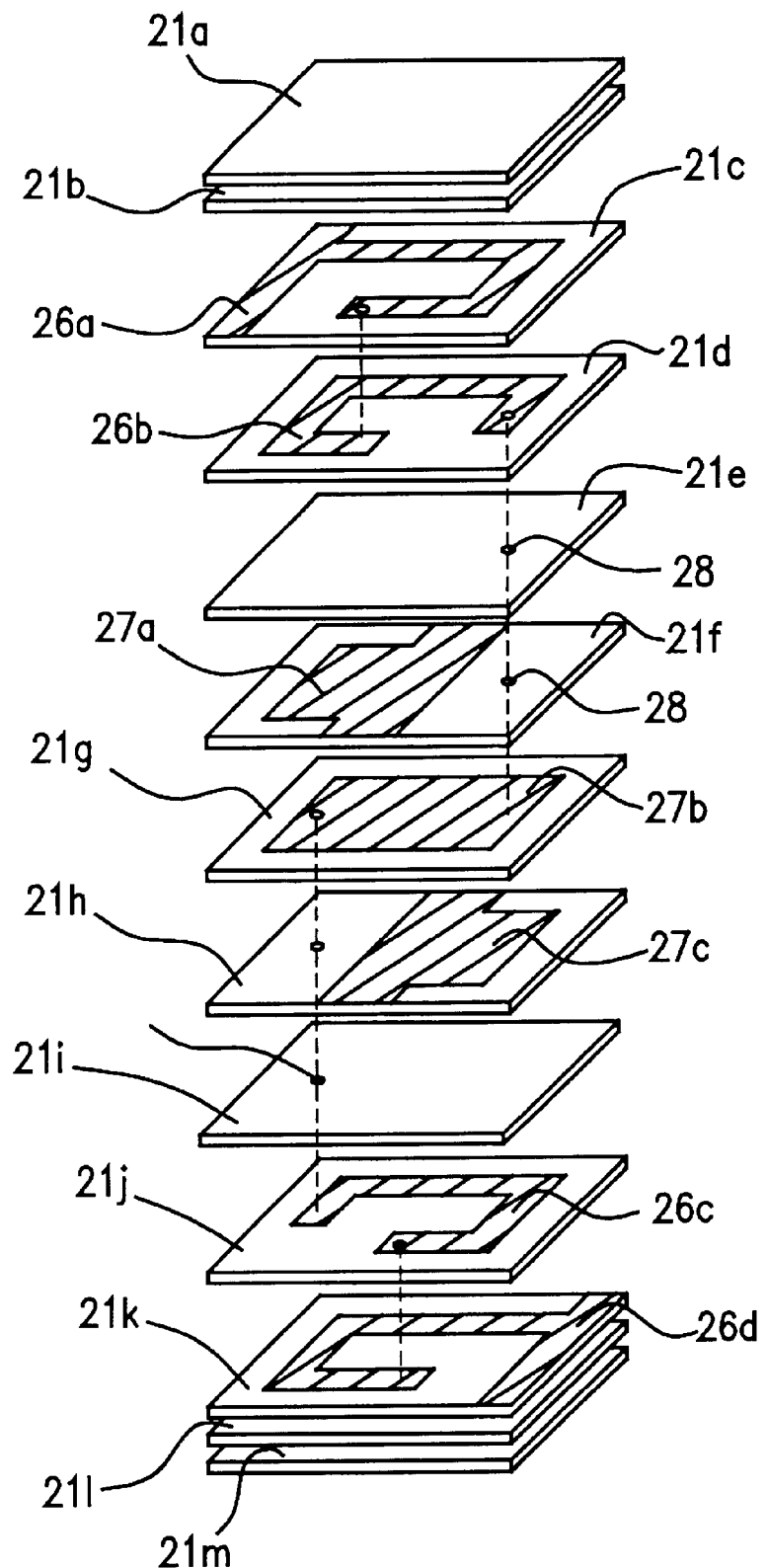
FIG. 3 is an exploded perspective view of ceramic green sheets and electrode patterns formed thereon which are used for producing a monolithic ceramic electronic component in accordance with a second embodiment of the present invention.
Figure 4:
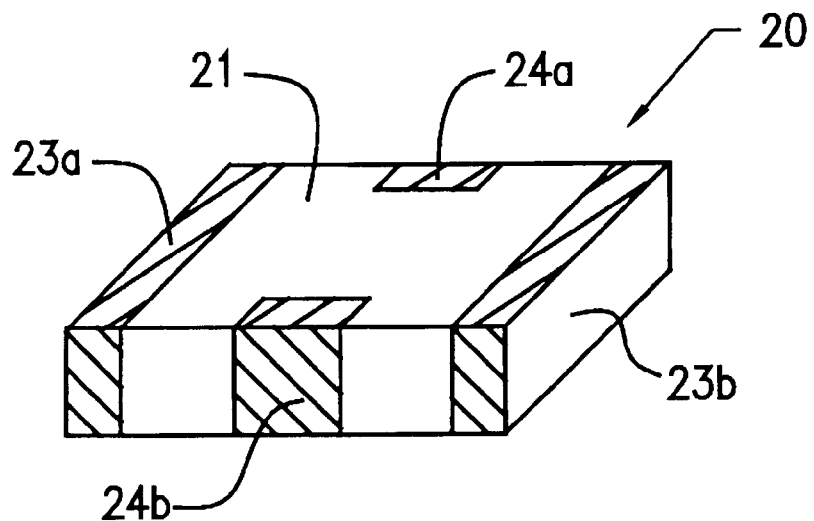
FIG. 4 is a perspective view of the monolithic ceramic electronic component in accordance with the second embodiment of the present invention.
Figure 5:
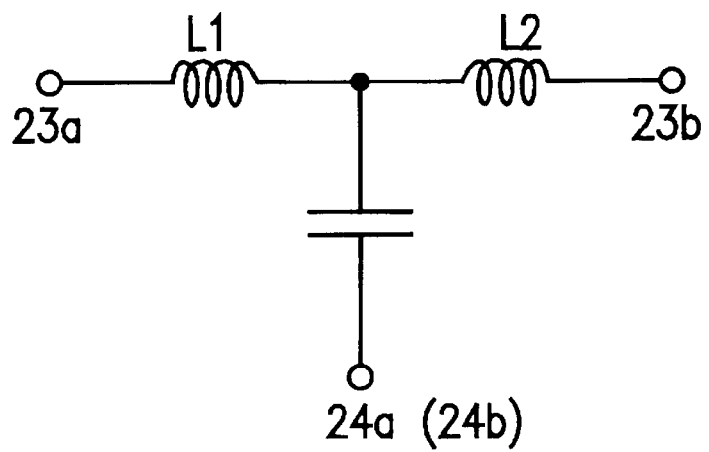
FIG. 5 is a circuit diagram of the monolithic ceramic electronic component shown in FIG. 4.

FIGS. 3 to 5 are an exploded perspective view, an outline perspective view and a circuit diagram, respectively, of a monolithic ceramic electronic component as a second embodiment of the present invention.

The monolithic ceramic electronic component 20 shown in FIG. 4 is an LC filter. A circuit constituting inductances L and an electrostatic capacitance C are formed in a sintered ceramic body 21, as described below. The sintered ceramic body 21 is formed of the high-frequency dielectric ceramic composition in accordance with the present invention. External electrodes 23a, 23b, 24a and 24b are formed on outer surfaces of the sintered ceramic body 21. An LC resonant circuit is formed between the external electrodes 23a, 23b, 24a and 24b.

The configuration of the sintered ceramic body 21 will be apparent from the method for making the same, which will be described with reference to FIG. 3.

An organic vehicle is added to the dielectric ceramic composition in accordance with the present invention to form a ceramic slurry. A ceramic green sheet is formed by a conventional sheeting method using the ceramic slurry. The ceramic green sheet is dried and punched out into predetermined rectangular green sheets 21a to 21m having a predetermined size.

Holes for via hole electrodes 28 are formed in the ceramic green sheets 21a to 21m according to a predetermined design. A conductive paste is screen-printed thereon to form coil conductors 26a and 26b, internal electrodes 27a to 27c for capacitors, coil conductors 26c and 26d and is simultaneously supplied into the holes to form the via hole electrodes 28.

The ceramic green sheets 21a to 21m are laminated as shown in the drawing and are compressed in the thickness direction to form a green laminate.

The green laminate is sintered to form a sintered ceramic body 21. External electrodes 23a to 24b shown in FIG. 4 are formed on the sintered ceramic body 21 by a thin-film forming process, such as coating, baking, vapor deposition, plating, or sputtering. A monolithic ceramic component 20 is thereby produced.

As shown in FIG. 3, the coil conductors 26a and 26b form an inductance unit L1 shown in FIG. 5, the coil conductors 26c and 26d form another inductance unit L2 and the internal electrodes 27a to 27c form a capacitor C.

Since the monolithic ceramic electronic component 20 in this embodiment has the LC filter and the sintered ceramic body 21 is composed of the dielectric ceramic composition in accordance with the present invention, the monolithic ceramic electronic component 20 can be sintered at a low temperature by a one-shot sintering process using a low-melting-point metal, such as copper, silver or gold, for the coil conductors 26a to 26c as the internal electrodes and for the internal electrodes 27a to 27c for the capacitor. The LC filter has a high specific dielectric constant, a high Q value at a high-frequency range and a small change in resonant frequency temperature coefficient τf, and is suitable for high-frequency ranges.

The monolithic ceramic module 1 and the monolithic ceramic electronic component 20 constituting the LC filter are described in the first and second embodiments, respectively. The ceramic electronic component and the monolithic ceramic electronic component in accordance with the present invention, however, are not limited to the above embodiments. For example, the present invention is also applicable to various monolithic ceramic substrates, such as a monolithic ceramic substrate for a multi-chip module and a monolithic ceramic substrate for a hybrid IC; various ceramic electronic components in which electronic elements are mounted on monolithic ceramic substrates; and monolithic chip electronic components, such as monolithic chip capacitors and monolithic chip dielectric antennas.

In the dielectric ceramic composition in accordance with the present invention, the specific amounts of the auxiliary components are compounded with the major component represented by the above formula. This dielectric ceramic composition can be sintered together with inexpensive metals having low resistance, such as silver and copper, at 1,000° C. or less. Thus, these metals can be used as internal electrode materials in, for example, monolithic ceramic substrates and monolithic ceramic electronic components. As a result, the monolithic ceramic substrates and the monolithic ceramic electronic components can be miniaturized.

The dielectric ceramic composition exhibits a high dielectric constant, that is, of approximately 30 or more, and a high Q value, that is, of approximately 2,000 or more at 8 GHz. Moreover, the dielectric ceramic composition exhibits a small resonant frequency temperature coefficient. Thus, the dielectric ceramic composition is suitably used in capacitors and LC resonant circuits for high-frequency use.

Since the dielectric ceramic composition does not contain $B_2O_3$ as an auxiliary component, the composition exhibits high humidity resistance and facilitates production of highly reliable high-frequency electronic components.

When specified amounts of manganese compounds and tantalum compounds are added, the Q value is further increased.

When $4.30 \leq x \leq 4.45$ and $y \leq 0.1$ in the formula, the Q value is further increased.

When at least one of the zinc compound, the silicon compound, the alkali metal compound, the copper compound and the bismuth compound is vitrified and is added, the composition can be sintered at a lower temperature.

The monolithic ceramic substrate in accordance with the present invention comprises a ceramic substrate including dielectric ceramic layers comprising the above dielectric ceramic composition and a plurality of internal electrodes formed in the dielectric ceramic layers. This monolithic ceramic substrate can be sintered at a low temperature and inexpensive metals having low resistance, such as silver and copper, can be used for the internal electrodes. Since the dielectric ceramic layers have a high dielectric constant, a high Q value and a small change in resonant frequency with temperature, the monolithic ceramic substrate is suitable for high-frequency use. Since the dielectric ceramic layers do not contain $B_2O_3$ as an auxiliary component, the monolithic ceramic substrate has high humidity resistance and high environmental resistance.

When a second ceramic layer having a lower dielectric constant than that of the dielectric ceramic layer is provided on at least one surface of the dielectric ceramic layer, the strength and the environmental properties can be adjusted by the composition and the laminated state of the second ceramic layer.

When a plurality of internal electrodes are stacked with parts of the dielectric ceramic layers provided therebetween, a large electrostatic capacitance is easily formed. Since the dielectric ceramic composition has a high dielectric constant, the opposing area of each external electrode can be reduced. As a result, the size of the capacitor portion can be reduced.

When the plurality of internal electrodes comprise internal capacitor electrodes constituting a capacitor deposited with at least parts of the dielectric ceramic layers therebetween, and coil conductors constituting a laminated inductor by being connected to each other, a compact LC resonant circuit suitable for high-frequency use can be easily formed.

The ceramic electronic component in accordance with the present invention including the monolithic ceramic substrate of the present invention and at least one electronic element formed on the monolithic ceramic substrate can be miniaturized and is suitable for high-frequency use.

When a cap is fixed-to the monolithic ceramic substrate so as to surround the electronic elements, the ceramic electronic component exhibits superior humidity resistance due to the protective effect of the cap.

When a conductive cap is used as the cap, the electronic elements can be electromagnetically shielded.

When external electrodes are formed only on the bottom face of the monolithic ceramic substrate, the bottom face of the monolithic ceramic substrate can be easily mounted onto a printed circuit board.

Since a plurality of internal electrodes are formed in the dielectric ceramic composition of the monolithic ceramic electronic component, the component can be sintered at a low temperature and inexpensive metals having low resistance, such as silver and copper, can be used as internal electrode materials.

What is claimed is:

1. A dielectric ceramic composition comprising:
   100 parts by weight of a main component represented by the formula $BaO-x\{(1-y)TiO_2 \cdot yZrO_2\}$ wherein $3.5 \leq x \leq 4.5$ and $0 \leq y \leq 0.2$; and an auxiliary component comprising:
  about 5 to 30 parts by weight, on a ZnO basis, of zinc compound;
  about 0.5 to 6 parts by weight, on a $SiO_2$ basis, of silicon compound;
  about 0.1 to 3 parts by weight, on an oxide ($R_2O$) basis, of alkali metal compound, wherein R is alkali metal;
  about 0.1 to 7 parts by weight, on a CuO basis, of copper compound; and
  about 0.1 to 6 parts by weight, on a $V_2O_5$ basis or a $Bi_2O_3$ basis, respectively, of a vanadium compound or bismuth compound.

2. A dielectric ceramic composition according to claim 1, wherein the auxiliary component further comprises about 0.5 parts by weight or less, on a $MnO_2$ basis, of manganese compound and about 1.2 parts by weight or less, on a $Ta_2O_5$ basis, of tantalum compound.

3. A dielectric ceramic composition according to claim 2, wherein $4.30 \leq x \leq 4.45$ and $0 < y \leq 0.1$.

4. A dielectric ceramic composition according to claim 3, wherein the auxiliary component comprises about 6 to 13 parts by weight, on a ZnO basis, of zinc compound; about 1 to 4 parts by weight, on a $SiO_2$ basis, of silicon compound; about 0.5 to 2 parts by weight, on an oxide ($R_2O$) basis, of alkali metal compound; about 2 to 6 parts by weight, on a CuO basis, of copper compound; about 0.5 to 2 parts by weight, on a $V_2O_5$ basis, of a vanadium compound or about 0.5 to 3 parts by weight, of a $Bi_2O_3$ basis, of a bismuth compound; about 0.3 parts by weight or less, on a $MnO_2$ basis, of manganese compound; and about 1 parts by weight or less, on a $Ta_2O_5$ basis, of tantalum compound.

5. A dielectric ceramic composition according to claim 4, wherein at least one constituent of the auxiliary component is vitrified.

6. A monolithic ceramic electronic component comprising:
  a sintered ceramic body comprising a dielectric ceramic composition according to claim 5 and having outer surfaces;
  a plurality of internal electrodes disposed in the sintered ceramic body; and
  a plurality of external electrodes on outer surfaces of the sintered ceramic body, each being electrically connected to one of the internal electrodes.

7. A dielectric ceramic composition according to claim 1, wherein at least one constituent of the auxiliary component is vitrified.

8. A dielectric ceramic composition according to claim 1, wherein $4.30 \leq 33 \leq 4.45$ and $0 < y \leq 0.1$ 9. A dielectric ceramic composition according to claim 1, wherein the auxiliary component comprises about 6 to 13 parts by weight, on a ZnO basis, of zinc compound; about 1 to 4 parts by weight, on a $SiO_2$ basis, of silicon compound; about 0.5 to 2 parts by weight, on an oxide ($R_2O$) basis, of alkali metal compound; about 2 to 6 parts by weight, on a CuO basis, of copper compound; about 0.5 to 2 parts by weight, on a $V_2O_5$ basis, of a vanadium compound or about 0.5 to 3 parts by weight, of a $Bi_2O_3$ basis, of a bismuth compound.

10. A monolithic ceramic substrate comprising:
  a plurality of first dielectric ceramic layers, each of which comprises a dielectric ceramic composition according to claim 1 and has at least two faces; and
  a plurality of internal electrodes disposed in the plurality of first dielectric ceramic layers.

11. A monolithic ceramic substrate according to claim 10 having a second ceramic layer which has a dielectric constant which is lower than that of the first dielectric ceramic layers and which is disposed on at least one face of at least one of the first dielectric ceramic layers.

12. A monolithic ceramic substrate according to claim 11, wherein at least two of the plurality of internal electrodes and at least part of one first dielectric ceramic layers are disposed so as to form a capacitor.

13. A monolithic ceramic substrate according to claim 12 wherein a plurality of internal electrodes are disposed so as to form a coil conductor.

14. A ceramic electronic component comprising:
  a monolithic ceramic substrate according to claim 10 and having top and bottom faces; and
  at least one electronic element mounted on the monolithic ceramic substrate so as to form a circuit with at least one of the internal electrodes.

15. A ceramic electronic component according to claim 14, further comprising a cap disposed on the monolithic ceramic substrate so as to surround the electronic element.

16. A ceramic electronic component according to claim 15, wherein the cap is conductive.

17. A ceramic electronic component according to claim 16, further comprising:
  a plurality of external electrodes on the bottom face of the monolithic ceramic substrate; and
  a plurality of through hole conductors electrically connected to the external electrodes and to at least one of the internal electrodes and the electronic element.

18. A monolithic ceramic electronic component comprising:
  a sintered ceramic body comprising a dielectric ceramic composition according to claim 1 and having outer surfaces;
  a plurality of internal electrodes disposed in the sintered ceramic body; and
  a plurality of external electrodes on outer surfaces of the sintered ceramic body, each being electrically connected to one of the internal electrodes.

19. A monolithic ceramic electronic component according to claim 18, wherein at least two of the plurality of internal electrodes and at least part of the dielectric ceramic are disposed so as to form a capacito.

20. A monolithic ceramic electronic component according to claim 19, wherein a plurality of internal electrodes are disposed so as to form a coil conductor.

* * * * *